United States Patent
Ogawa et al.

(10) Patent No.: US 12,469,713 B2
(45) Date of Patent: Nov. 11, 2025

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Arito Ogawa, Toyama (JP); Shogo Hayasaka, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/206,902

(22) Filed: Mar. 19, 2021

(65) Prior Publication Data
US 2021/0305058 A1   Sep. 30, 2021

(30) Foreign Application Priority Data

Mar. 25, 2020 (JP) .................................. 2020-054333

(51) Int. Cl.
*H01L 21/311* (2006.01)
*H01L 21/02* (2006.01)
*H01L 21/67* (2006.01)

(52) U.S. Cl.
CPC .. *H01L 21/31122* (2013.01); *H01L 21/02356* (2013.01); *H01L 21/67069* (2013.01)

(58) Field of Classification Search
CPC ..................... H01L 21/31116; H01L 21/28194
See application file for complete search history.

(56) References Cited

U.S. PATENT DOCUMENTS

| | | | |
|---|---|---|---|
| 7,951,683 B1 * | 5/2011 | Shanker | H01L 21/31116 257/E21.546 |
| 2011/0003482 A1 | 1/2011 | Ogawa et al. | |
| 2015/0279736 A1 | 10/2015 | Hotta et al. | |
| 2017/0365478 A1 | 12/2017 | George et al. | |
| 2018/0047577 A1 * | 2/2018 | Clark | H01L 21/31116 |
| 2018/0211844 A1 | 7/2018 | Lin et al. | |
| 2018/0230405 A1 * | 8/2018 | Kneer | C11D 7/5022 |
| 2018/0247827 A1 | 8/2018 | Nakaya et al. | |
| 2019/0242019 A1 | 8/2019 | Blomberg et al. | |
| 2019/0348274 A1 | 11/2019 | Park et al. | |
| 2020/0035493 A1 * | 1/2020 | Clark | C23C 16/56 |
| 2020/0266098 A1 * | 8/2020 | Pore | H01L 21/0228 |

(Continued)

FOREIGN PATENT DOCUMENTS

| | | |
|---|---|---|
| CN | 110050331 A | 7/2019 |
| CN | 110473769 A | 11/2019 |
| JP | 2011-014704 A | 1/2011 |

(Continued)

OTHER PUBLICATIONS

"Silicon dioxide", Wikipedia, no date.*

(Continued)

*Primary Examiner* — Thomas T Pham
(74) *Attorney, Agent, or Firm* — Volpe Koenig (57) ABSTRACT

There is provided a technique that includes etching a crystalline film formed on a substrate by performing a cycle a predetermined number of times, the cycle including non-simultaneously performing: (1) supplying a boron-containing gas to the crystalline film; and (2) supplying a halide gas to the crystalline film.

17 Claims, 7 Drawing Sheets

(56) References Cited

U.S. PATENT DOCUMENTS

2022/0119962 A1    4/2022  Blomberg et al.

FOREIGN PATENT DOCUMENTS

| | | |
|---|---|---|
| JP | 2015-190020 A | 11/2015 |
| JP | 2017-022327 A | 1/2017 |
| JP | 2018-500767 A | 1/2018 |
| JP | 2018-026566 A | 2/2018 |
| JP | 2018-142691 A | 9/2018 |
| JP | 2019-196545 A | 11/2019 |
| JP | 2020-501373 A | 1/2020 |

OTHER PUBLICATIONS

Singapore Search Report issued on Jan. 11, 2022 for Singapore Patent Application No. 10202102837U.
Singapore Written Opinion issued on Jan. 11, 2022 for Singapore Patent Application No. 10202102837U.
Korean Office Action issued on Dec. 20, 2022 for Korean Patent Application No. 10-2021-0035989.
Japanese Office Action issued on May 30, 2023 for Japanese Patent Application No. 2022-100993.
Chinese Office Action issued on Jul. 14, 2023 for Chinese Patent Application No. 202110299505.2.
Chinese Office Action issued on Mar. 21, 2024 for Chinese Patent Application No. 202110299505.2.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2020-054333, filed on Mar. 25, 2020, the entire contents of which are incorporated herein by reference.

TECHNICAL FIELD

The present disclosure relates to a method of manufacturing a semiconductor device, a substrate processing apparatus, and a recording medium.

BACKGROUND

As a block layer of a 3D NAND flash memory of a NAND type having a three-dimensional structure, for example, there may be a case that a crystalline film is used. Furthermore, from the viewpoint of a low resistance of a control gate, it may be required to make the crystalline film into a thin film.

SUMMARY

When making the crystalline film into the thin film by etching, the etching rate becomes lower than that of a case that etches a non-crystalline film (amorphous film), so that there is a case that it is difficult to perform etching.

Some embodiments of the present disclosure provide a technique capable of improving an etching rate for a crystalline film formed on a substrate.

According to one or more embodiments of the present disclosure, there is provided a technique that includes etching a crystalline film formed on a substrate by performing a cycle a predetermined number of times, the cycle including non-simultaneously performing: (1) supplying a boron-containing gas to the crystalline film; and (2) supplying a halide gas to the crystalline film.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

Figure 1:
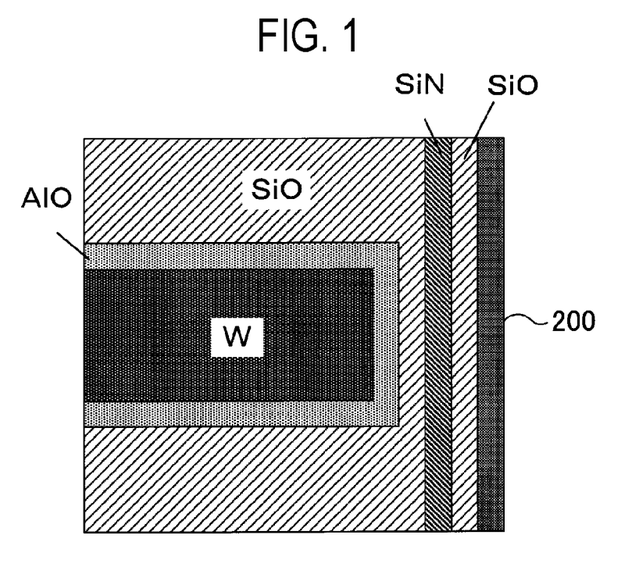
FIG. 1 is a diagram showing a portion of a cross section of a substrate to which embodiments of the present disclosure may be applied.

Hereinafter, one or more embodiments of the present disclosure will be described. As shown in FIG. 1 as an example, when a crystallized aluminum oxide ($Al_2O_3$) film (hereinafter, also referred to as crystalline AlO film) is used as a block layer of a 3D NAND, it is required to make the crystalline AlO film into a thin film to increase an area where a W film is embedded. Further, to improve a performance of a 3D NAND, it is required to form the crystalline AlO film as a block layer with good step coverage on a surface of a structure having a high aspect ratio such as a 3D NAND or the like. In the present embodiment, as a process of a semiconductor device manufacturing process, an example of a process of forming a crystalline AlO film having a thickness of 2 nm or less on a wafer 200 will be described.

Figure 2:
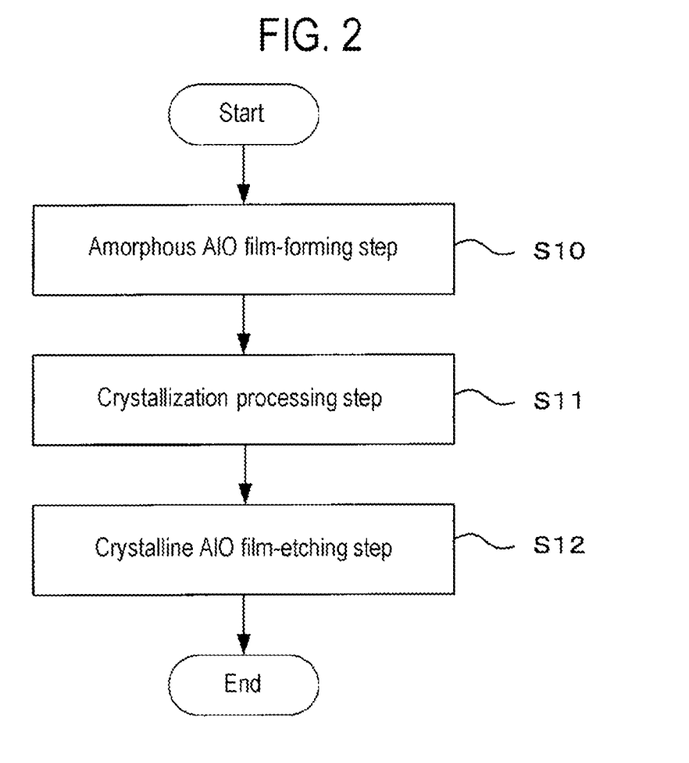
FIG. 2 is a diagram showing a substrate processing process according to the embodiments of the present disclosure.

As shown in FIG. 2, an amorphous AlO film-forming step (step S10) for forming an amorphous AlO film, a crystallization processing step (step S11) for crystallizing the amorphous AlO film, and a crystalline AlO film-etching step (step S12) for etching the crystalline AlO film obtained by crystallization are performed to form a crystalline AlO film having a thickness of 2 nm or less on the wafer 200.

When the term "wafer" is used herein, it may refer to "a wafer itself" or "a laminated body of a wafer and a predetermined layer or film formed on the surface of the wafer." When the phrase "a surface of a wafer" is used herein, it may refer to "a surface of a wafer itself" or "a surface of a predetermined layer or the like formed on a wafer." When the expression "a predetermined layer is formed on a wafer" is used herein, it may mean that "a predetermined layer is directly formed on a surface of a wafer itself" or that "a predetermined layer is formed on a layer or the like formed on a wafer." When the term "substrate" is used herein, it may be synonymous with the term "wafer."

[Amorphous AlO Film-Forming Step, Step S10]

An amorphous AlO film having a thickness of 9 nm or more as a first film thickness is formed on a wafer 200 by performing a cycle a predetermined number of times, the cycle including non-simultaneously supplying a trimethylaluminum (TMA, $(CH_3)_3Al$) gas as a precursor gas and an ozone ($O_3$) gas, which is an oxidation gas as a reaction gas, to the wafer 200.

[Crystallization Processing Step, Step S11]

Next, the amorphous AlO film having a thickness of 9 nm or more formed on the wafer 200 is heated to a temperature lower than 900 degrees C., for example, 800 degrees C., which is a predetermined crystallization processing temperature. That is, the heat treatment is performed on the amorphous AlO film at a temperature lower than 900 degrees C. As a result, the amorphous AlO film having a thickness of 9 nm or more formed on the wafer 200 is crystallized, and a crystalline AlO film is formed.

In this regard, the crystallization processing temperature required to crystallize the amorphous AlO film is higher as the film thickness is smaller, and is lower as the film thickness is larger. In the present embodiment, the crystallization processing temperature is set to a temperature lower than a temperature required for crystallizing a non-crystalline film having a second film thickness smaller than 9 nm as the first film thickness. For example, in order to crystallize an amorphous AlO film having a thickness of 2 nm or less which is smaller than 9 nm, the heat treatment should be performed at 1000 degrees C. or higher, at which there is a concern about the heat influence on other films formed on the wafer 200 and a cell collapse. In this step, the amorphous AlO film having a thickness of 9 nm or more is crystallized by performing heat treatment at the crystallization processing temperature in a range of less than 900 degrees C. By setting the thickness of the amorphous AlO film to be crystallized by the heat treatment to 9 nm or more, it is possible to crystallize the amorphous AlO film by the heat treatment at lower than 900 degrees C. That is, by performing the treatment at lower than 900 degrees C., the amorphous AlO film can be crystallized while suppressing the influence of heat.

In the case of an amorphous AlO film having a thickness of 9 nm or more, the crystallization processing temperature is set to a temperature of 400 degrees C. or higher and lower than 900 degrees C., specifically 800 degrees C. or higher and lower than 900 degrees C. By setting the crystallization processing temperature to 400 degrees C. or higher, it is possible to promote the crystallization of the amorphous AlO film. Further, by setting the crystallization processing temperature to 800 degrees C. or higher, it becomes possible to reliably crystallize the amorphous AlO film having a thickness of 9 nm or higher.

[Crystalline AlO Film-Etching Step, Step S12]

Next, an etching process is performed on the crystalline AlO film having the thickness of the first film thickness (9 nm or more) formed on the wafer 200 by ALE (Atomic Layer Etching) until the thickness of the crystalline AlO film becomes a thickness of a second film thickness (e.g., 2 nm or less) which is smaller than the first film thickness. First, a process furnace 202 of a substrate processing apparatus that performs the etching process will be described with reference to FIGS. 3 to 5.

(1) Configuration of Substrate Processing Apparatus

Figure 3:
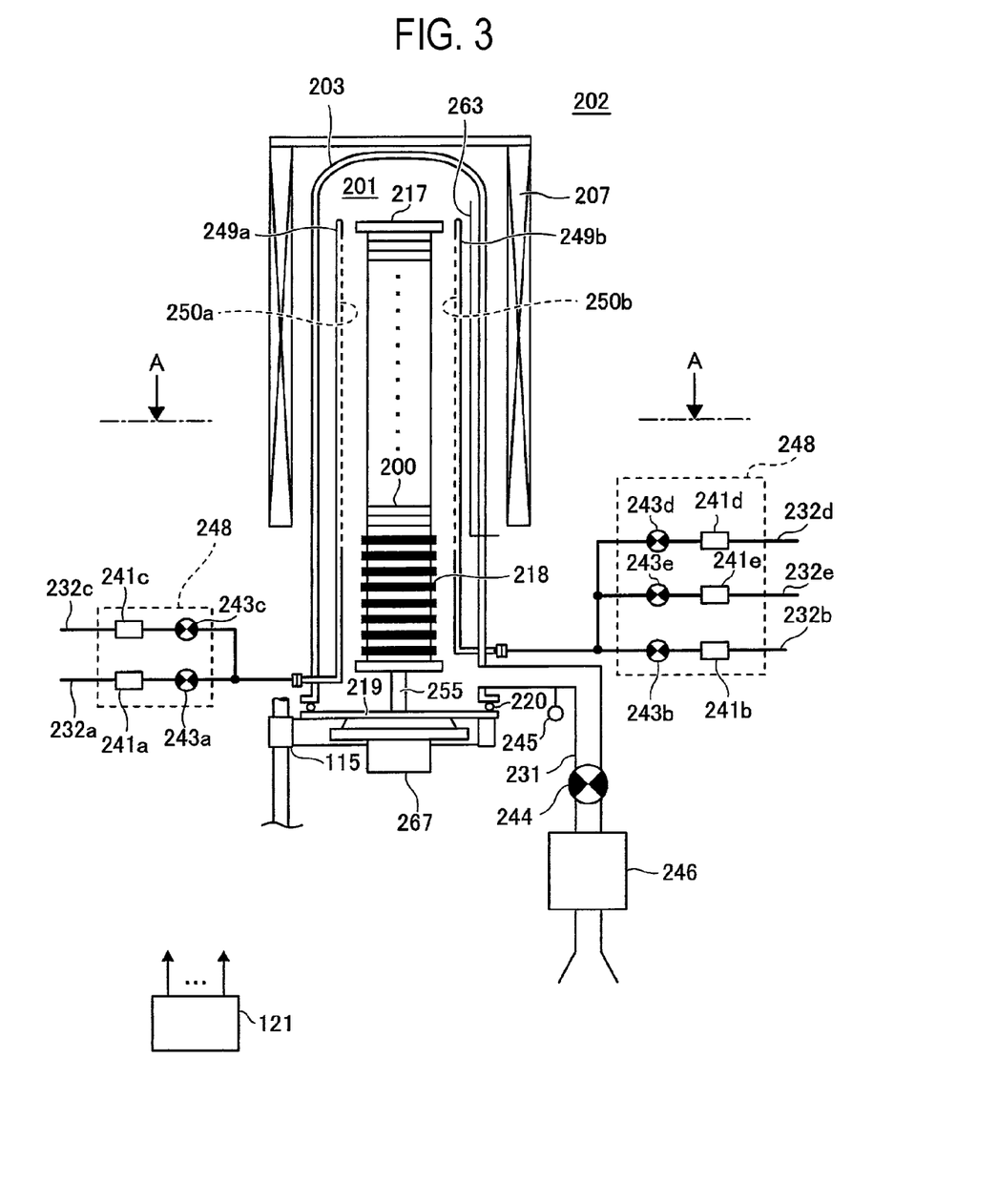
FIG. 3 is a schematic configuration view of a vertical process furnace of a substrate processing apparatus suitably used in the embodiments of the present disclosure, in which a portion of the process furnace is illustrated in a vertical cross-sectional view.

As shown in FIG. 3, the process furnace 202 includes a heater 207 as a heating mechanism (temperature adjustment part). The heater 207, which has a cylindrical shape, is vertically installed by being supported by a holding plate. The heater 207 also functions as an activation mechanism (excitation part) for activating (exciting) a gas with heat.

Inside the heater 207, a reaction tube 203 is arranged concentrically with the heater 207. The reaction tube 203 is made of a heat-resistant material such as quartz ($SiO_2$) or silicon carbide (SiC), and is formed in a cylindrical shape with an upper end thereof closed and a lower end thereof opened. A process chamber 201 is formed in the hollow portion of the reaction tube 203. The process chamber 201 is configured to accommodate wafers 200 as substrates. The wafers 200 are processed in the process chamber 201.

Nozzles 249a and 249b are provided in the process chamber 201 so as to penetrate a lower side wall of the reaction tube 203. Gas supply pipes 232a and 232b are connected to the nozzles 249a and 249b, respectively.

In the gas supply pipes 232a and 232b, mass flow controllers (MFCs) 241a and 241b, which are flow rate controllers (flow rate control parts), and valves 243a and 243b, which are opening/closing valves, are installed, respectively, sequentially from the upstream side of the gas flow. A gas supply pipe 232c is connected to the gas supply pipe 232a at the downstream side of the valve 243a. Gas supply pipes 232d and 232e are connected to the gas supply pipe 232b at the downstream side of the valve 243b. MFCs 241c, 241d, and 241e and valves 243c, 243d, and 243e are respectively installed to the gas supply pipes 232c, 232d and 232e, sequentially from the upstream side of the gas flow.

Figure 4:
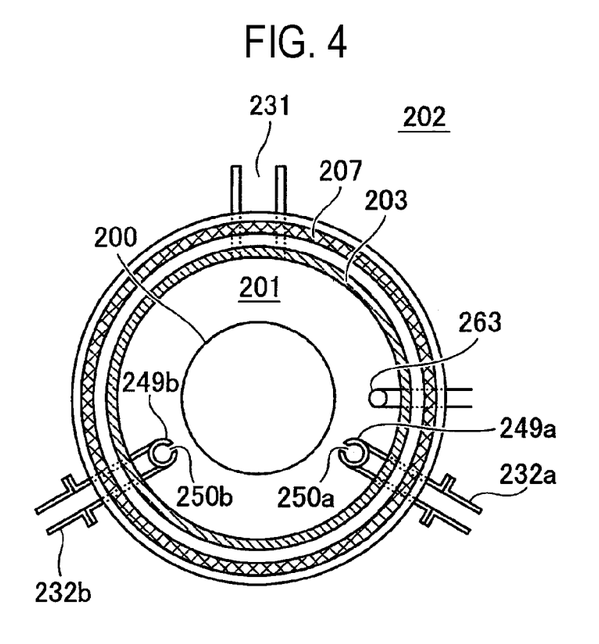
FIG. 4 is a schematic configuration view of the vertical process furnace of the substrate processing apparatus suitably used in the embodiments of the present disclosure, in which a portion of the process furnace is illustrated in a cross-sectional view taken along line A-A in FIG. 3.

As shown in FIG. 4, the nozzles 249a and 249b are respectively installed at a space, which has an annular shape in a plane view, between an inner wall of the reaction tube 203 and the wafers 200 so as to extend upward in the arrangement direction of the wafers 200 along the inner wall of the reaction tube 203 from the lower portion of the reaction tube 203 to the upper portion of the reaction tube 203. That is, the nozzles 249a and 249b are respectively installed at the lateral side of the wafer arrangement region at which the wafers 200 are arranged, namely at a region horizontally surrounding a wafer arrangement region, so as to extend along the wafer arrangement region. Gas supply holes 250a and 250b for supplying gases are formed on the side surfaces of the nozzles 249a and 249b, respectively. The gas supply holes 250a and 250b are opened toward the center of the reaction tube 203 to allow the gas to be supplied toward the wafers 200. The gas supply holes 250a and 250b are installed in a plural number between a lower portion of the reaction tube 203 and an upper portion of the reaction tube 203.

From the gas supply pipe 232a, a boron-containing gas, for example, a boron trichloride ($BCl_3$) gas, which is a boron-containing halide gas, is supplied into the process chamber 201 via the MFC 241a, the valve 243a and the nozzle 249a.

From the gas supply pipe 232b, a halide gas, for example, a hydrogen fluoride (HF) gas is supplied into the process chamber 201 via the MFC 241b, the valve 243b and the nozzle 249b.

From the gas supply pipes 232c and 232d, a nitrogen ($N_2$) gas as an inert gas is supplied into the process chamber 201 via the MFCs 241c and 241d, the valves 243c and 243d, the gas supply pipes 232a and 232b, and the nozzles 249a and 249b. The $N_2$ gas acts as a purge gas, a carrier gas, a dilution gas, and the like.

From the gas supply pipe 232e, as a gas having a hydrogen group, for example, a trimethylaluminum (TMA, $(CH_3)_3Al$) gas having a methyl group, which is a gas having a hydrocarbon group and a gas having an alkyl group, is supplied into the process chamber 201 via the MFC 241e, the valve 243e, the gas supply pipe 232b and the nozzle 249b.

A boron-containing gas supply system configured to supply a boron-containing gas is mainly constituted by the gas supply pipe 232a, the MFC 241a and the valve 243a. A halide gas supply system configured to supply a halide gas is mainly constituted by the gas supply pipe 232b, the MFC 241b and a valve 243b. An inert gas supply system configured to supply an inert gas is mainly constituted by the gas supply pipes 232c and 232d, the MFC 241c and 241d, and the valves 243c and 243d. A hydrogen group-containing gas supply system configured to supply a gas having a hydrogen group is mainly constituted by the gas supply pipe 232e, the MFC 241e and the valve 243e.

Some or all of the various supply systems described above may be configured as an integrated supply system 248 in which the valves 243a to 243e, the MFC 241a to 241e and the like are integrated. The integrated supply system 248 is connected to each of the gas supply pipes 232a to 232e, and is configured so that the operations of supplying various gases into the gas supply pipes 232a to 232e, i.e., the opening/closing operations of the valves 243a to 243e, the flow rate adjustment operations by the MFCs 241a to 241e, and the like are controlled by a controller 121 described later. The integrated supply system 248 is configured as a one piece type or division-type integrated unit, and is configured so that it can be attached to and detached from the gas supply pipes 232a to 232e on the integrated unit basis and so that the maintenance, replacement, expansion, and the like can be performed on an integrated unit basis.

An exhaust pipe 231 that exhausts the gas in the process chamber 201 is connected to the lower portion of the side wall of the reaction tube 203. A vacuum pump 246 as vacuum-exhausting device is connected to the exhaust pipe 231 via a pressure sensor 245 as a pressure detector (pressure detection part) for detecting the pressure in the process chamber 201 and an APC (Auto Pressure Controller) valve 244 as a pressure regulator (pressure regulation part). The APC valve 244 is configured to perform or stop a vacuum-exhausting operation in the process chamber 201 by opening and closing the APC valve 244 while the vacuum pump 246 is actuated, and is also configured to adjust an internal pressure of the process chamber 201 by adjusting a valve opening degree of the APC valve 244 based on the pressure information detected by the pressure sensor 245 while the vacuum pump 246 is actuated. An exhaust system is mainly constituted by the exhaust pipe 231, the pressure sensor 245 and the APC valve 244. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is made of a metallic material such as, for example, stainless steel or the like and is formed in a disk shape. An O-ring 220 as a sealing member that comes into contact with the lower end of the reaction tube 203 is provided on the upper surface of the seal cap 219. Below the seal cap 219, a rotation mechanism 267 for rotating a boat 217, which will be described later, is installed. The rotating shaft 255 of the rotation mechanism 267 penetrates the seal cap 219 and is connected to the boat 217. The rotation mechanism 267 is configured to rotate the wafers 200 by rotating the boat 217. The seal cap 219 is configured to be vertically raised and lowered by a boat elevator 115 as an elevating mechanism installed outside the reaction tube 203.

The boat elevator 115 is configured as a transfer device (transfer mechanism) for loading and unloading (transferring) the wafers 200 into and out of the process chamber 201 by raising and lowering the seal cap 219.

A boat 217 as a substrate support tool is configured so as to support a plurality of wafers 200, for example, 25 to 200 wafers 200 in a horizontal posture and in multiple stages while vertically arranging the wafers 200 with the centers thereof aligned with each other, i.e., so as to arrange the wafers 200 at intervals. The boat 217 is made of a heat-resistant material such as, for example, quartz or SiC. Heat insulating plates 218 made of a heat-resistant material such as, for example, quartz or SiC, are supported in a horizontal posture and in multiple stages at the bottom of the boat 217.

Inside the reaction tube 203, there is installed a temperature sensor 263 as a temperature detector. By adjusting the state of supply of electric power to the heater 207 based on the temperature information detected by the temperature sensor 263, the temperature inside the process chamber 201 becomes a desirable temperature distribution. The temperature sensor 263 is installed along the inner wall of the reaction tube 203.

Figure 5:
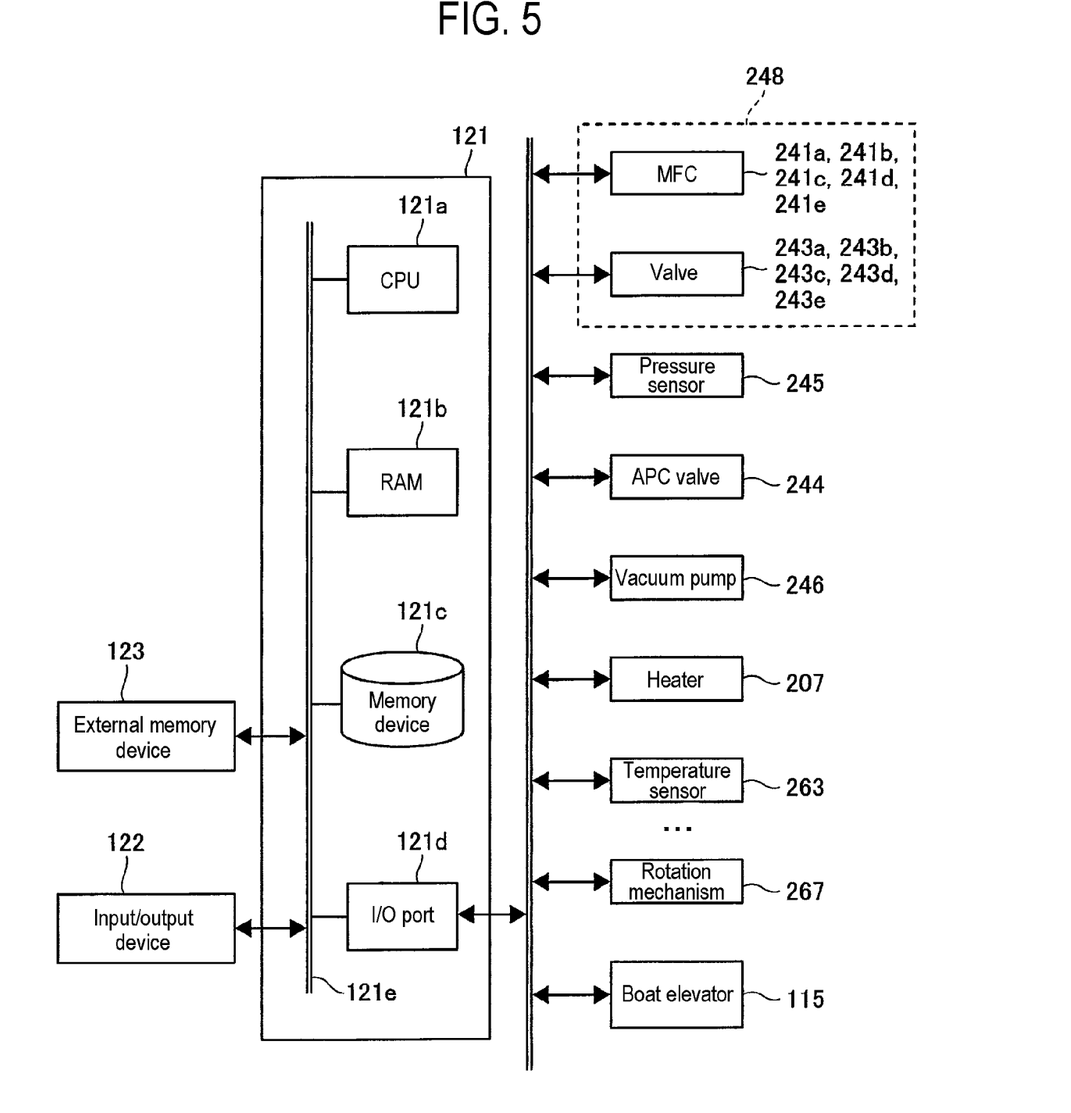
FIG. 5 is a schematic configuration diagram of a controller of the substrate processing apparatus suitably used in the embodiments of the present disclosure, in which a control system of the controller is illustrated in a block diagram.

As shown in FIG. 5, the controller 121 as a control part (control means) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like is connected to the controller 121.

The memory device 121c is configured by, for example, a flash memory, an HDD (Hard Disk Drive), or the like. A control program for controlling operations of the substrate processing apparatus, a process recipe in which procedures and conditions of substrate processing to be described later are written, are readably stored in the memory device 121c. The process recipe is a combination for causing the controller 121 to execute the respective procedures in a below-described substrate processing process so as to obtain a predetermined result. The process recipe functions as a program. Hereinafter, the process recipe, the control program and the like are collectively and simply referred to as a program. Furthermore, the process recipe is also simply referred to as a recipe. When the term "program" is used herein, it may mean a case of including only the recipe, a case of including only the control program, or a case of including both the recipe and the control program. The RAM 121b is configured as a memory area (work area) in which programs, data and the like read by the CPU 121a are temporarily held.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, and the like.

The CPU 121a is configured to read the control program from the memory device 121c and execute the read control program, and is configured to read the recipe from the memory device 121c in response to an input of an operation command from the input/output device 122 or the like. The CPU 121a is configured to be capable of, according to the contents of the recipe thus read, controlling the flow rate adjustment operation for various gases by the MFCs 241a to 241e, the opening and closing operations of the valves 243a to 243e, the opening and closing operation of the APC valve 244, the pressure regulation operation by the APC valve 244 based on the pressure sensor 245, the start and stop of the vacuum pump 246, the temperature adjustment operation of the heater 207 based on the temperature sensor 263, the rotation and the rotation speed adjustment operation of the boat 217 by the rotation mechanism 267, the raising and lowering operation of the boat 217 by the boat elevator 115, and the like.

The controller 121 may be configured by installing, on the computer, the above-described program stored in an external memory device 123. The external memory device 123 includes, for example, a magnetic disk such as an HDD or the like, an optical disk such as a CD or the like, a magneto-optical disk such as an MO or the like, a semiconductor memory such as a USB memory or the like, and so forth. The memory device 121c and the external memory device 123 are configured as a computer readable recording medium. Hereinafter, the memory device 121c and the external memory device 123 are collectively and simply referred to as a recording medium. As used herein, the term "recording medium" may include only the memory device 121c, only the external memory device 123, or both. The provision of the program to the computer may be performed by using a communication means such as the Internet or a dedicated line without having to use the external memory device 123.

(2) Crystalline AlO Film-Etching Step (Step S11)

Figure 6:
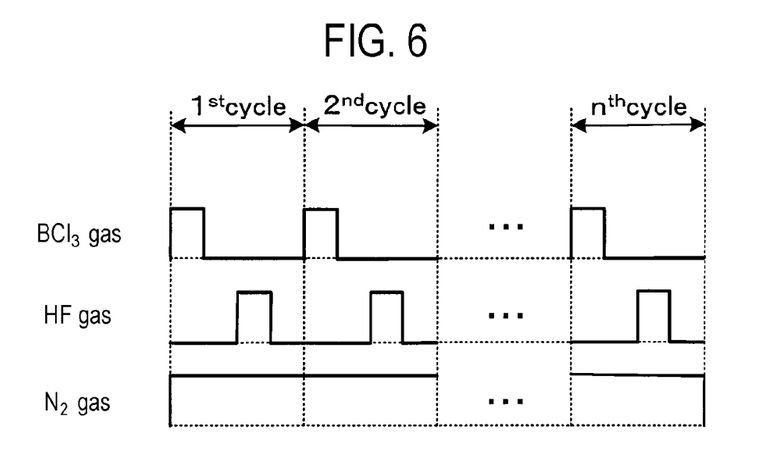
FIG. 6 is a diagram showing an etching process according to the embodiments of the present disclosure.

Next, the details of the crystalline AlO film-etching step using the process furnace 202 of the above-described substrate processing apparatus will be described with reference to FIG. 6. In the following description, the operation of each part constituting the substrate processing apparatus is controlled by the controller 121.

(Wafer Charging and Boat Loading)

A plurality of wafers 200 on which a crystalline AlO film having a thickness of 9 nm or more is formed, is charged into the boat 217 (wafer charging). Thereafter, the boat 217 supporting the plurality of wafers 200 is lifted up by the boat elevator 115 and loaded into the process chamber 201 (boat loading). In this state, the seal cap 219 seals the lower end of the reaction tube 203 via the O-ring 220.

(Pressure Adjustment and Temperature Adjustment)

The interior of the process chamber 201, namely, a space in which the wafers 200 are placed, is vacuum-exhausted (depressurization-exhausted) by the vacuum pump 246 to reach a desirable processing pressure (vacuum degree). Further, the wafers 200 in the process chamber 201 are heated by the heater 207 to a desirable processing temperature. The desirable processing temperature refers to a temperature equal to or lower than the above-mentioned crystallization processing temperature, specifically lower than the crystallization processing temperature. Further, the rotation mechanism 267 starts the rotation of the wafers 200. Actuating the vacuum pump 246 and heating and rotating the wafers 200 may be continuously performed at least until the processing of the wafers 200 is completed.

Then, the following steps S1 to S4 are sequentially performed on the crystalline AlO film formed on each of the wafers 200.

(BCl$_3$ Gas Supply, Step S1)

In this step, a BCl$_3$ gas, which is a boron-containing gas, is supplied to the wafers 200 in the process chamber 201. Specifically, the valve 243a is opened to allow the BCl$_3$ gas to flow into the gas supply pipe 232a. The flow rate of the BCl$_3$ gas is adjusted by the MFC 241a. The BCl$_3$ gas is supplied into the process chamber 201 via the nozzle 249a, and is exhausted from the exhaust pipe 231. At this time, the valves 243c and 243d are opened to allow an N$_2$ gas to flow into the gas supply pipes 232c and 232d.

An example of a process condition of this step is described as follows.

BCl$_3$ gas supply flow rate: 0.1 to 10 slm

N$_2$ gas supply flow rate (for each gas supply pipe): 0 to 10 slm

Each gas supply time: 5 to 300 seconds, specifically 100 to 200 seconds

Processing temperature: 200 degrees C. or higher and lower than 900 degrees C., specifically 300 to 800 degrees C., more specifically 300 to 450 degrees C.

Processing pressure: 150 to 400 Pa, specifically 200 to 300 Pa

It is desirable that the processing temperature is equal to or lower than the crystallization processing temperature that is the processing temperature in crystallizing the amorphous AlO film. By setting the processing temperature in this step to be equal to or lower than the crystallization processing temperature, the processing can be performed continuously from the crystallization processing step (step S11) while suppressing the heat influence on other films and the like formed on the wafers 200.

The notation of a numerical range such as "0.1 to 10 slm" in the present disclosure means that a lower limit value and an upper limit value are included in the range. Therefore, "0.1 to 10 slm" means "0.1 slm or more and 10 slm or less." The same applies to other numerical ranges.

By supplying the BCl$_3$ gas to the wafer 200 under the above condition, Al$_2$O$_3$ on the surface of the wafer 200 reacts with BCl$_3$ and O is desorbed from Al$_2$O$_3$ and replaced with Cl. That is, the molecular layer of Al$_2$O$_3$ exposed on the surface of the crystalline AlO film formed on the wafer 200 is modified to AlCl$_3$. Further, O desorbed from Al$_2$O$_3$ is combined with B to generate B$_2$O$_3$. Specifically, the supply of the BCl$_3$ gas causes the following reaction of BCl$_3$ with Al$_2$O$_3$ on the surface of the wafer 200.

As the inert gas, a rare gas such as an Ar gas, a He gas, a Ne gas, a Xe gas or the like may be used in addition to the N$_2$ gas.

(Purge, Step S2)

The valve 243a is closed to stop the supply of the BCl$_3$ gas. At this time, the APC valve 244 of the exhaust pipe 231 is left opened, the interior of the process chamber 201 is vacuum-exhausted by the vacuum pump 246, and the residual gas is removed from the wafer 200, whereby the unreacted BCl$_3$ gas or B$_2$O$_3$ as a reaction by-product, which remains in the process chamber 201, is removed from the process chamber 201. At this time, the valves 243c and 243d are kept opened to maintain the supply of the N$_2$ gas into the process chamber 201. The N$_2$ gas acts as a purge gas, so that the residual gas from the wafer 200 is removed, which makes it possible to enhance the effect of removing the unreacted BCl$_3$ gas or B$_2$O$_3$ as the reaction by-product, which remains in the process chamber 201, from the process chamber 201.

(HF Gas Supply, Step S3)

Next, an HF gas, which is a halide gas, is supplied to the wafers 200 in the process chamber 201. Specifically, the valve 243b is opened to allow the HF gas to flow into the gas supply pipe 232b. The flow rate of the HF gas is adjusted by the MFC 241b. The HF gas is supplied into the process chamber 201 via the nozzle 249b, and is exhausted from the exhaust pipe 231. At this time, the valves 243c and 243d are opened to allow an $N_2$ gas to flow into the gas supply pipes 232c and 232d.

An example of a process condition in this step is described as follows.

HF gas supply flow rate: 0.1 to 10 slm

$N_2$ gas supply flow rate (for each gas supply pipe): 0 to 10 slm

Each gas supply time: 5 to 200 seconds, preferably 60 to 150 seconds

Processing temperature: 200 degrees C. or higher and lower than 900 degrees C., specifically 300 to 800 degrees C., more specifically 300 to 450 degrees C.

Processing pressure: 150 to 400 Pa, preferably 200 to 300 Pa

By supplying the HF gas to the wafer 200 under the above condition, $AlCl_3$ on the surface of the wafer 200 reacts with HF, and a part of Cl is desorbed from $AlCl_3$ and replaced with F. As a result, the molecular layer of $AlCl_3$ formed on the surface of the wafer 200 is converted into volatile $AlCl_xF_y$, and desorbed from the surface of the wafer 200. Further, Cl desorbed from $AlCl_3$ is combined with H to generate hydrogen chloride (HCl). Then, $AlCl_xF_y$ and HCl are desorbed from the surface of the wafer 200 and discharged from the process chamber 201, whereby the surface of the crystalline AlO film is etched. Specifically, the supply of the HF gas causes the following reaction of HF with $AlCl_3$ on the surface of the wafer 200. As a result, the molecular layer of $Al_2O_3$ exposed on the surface of the crystalline AlO film formed on the wafer 200 is etched uniformly (with good step coverage).

$$AlCl_3 + 2HF \longrightarrow AlClF_2 + 2HCl$$
$$AlCl_3 + HF \longrightarrow AlCl_2F + HCl$$
$$AlCl_3 + 3HF \longrightarrow AlF_3 + 3HCl$$

(Purge, Step S4)

The valve 243b is closed to stop the supply of the HF gas. At this time, the APC valve 244 of the exhaust pipe 231 is left opened, the interior of the process chamber 201 is vacuum-exhausted by the vacuum pump 246, and the residual gas is removed from the wafer 200, whereby the unreacted HF gas and $AlCl_xF_y$ or HCl as reaction by-products, which remains in the process chamber 201, is removed from the process chamber 201. At this time, the valves 243c and 243d are kept opened to maintain the supply of the $N_2$ gas into the process chamber 201. The $N_2$ gas acts as a purge gas, so that the residual gas from the wafer 200 is removed, which makes it possible to enhance the effect of removing the unreacted HF gas or $AlCl_xF_y$ and HCl as reaction by-products, which remains in the process chamber 201, from the process chamber 201.

[Performing Predetermined Number of Times]

By performing a cycle a predetermined number of times (n times, where n is an integer of 1 or more), the cycle including non-simultaneously, that is, non-synchronously, performing the above-described steps S1 to S4 sequentially, the crystalline AlO film having a thickness of 9 nm or more on the wafer 200 can be etched and a crystalline AlO film having a predetermined film thickness, for example, a thickness of 2 nm or less can be obtained. It is desirable that the above cycle is repeated a plurality of times.

In this step, the $BCl_3$ gas is supplied to the surface of the wafer 200 to convert the exposed molecular layer of $Al_2O_3$ into $AlCl_3$ and then into $AlCl_xF_y$, whereby the crystalline AlO film can be etched efficiently (with a high etching rate). Therefore, in order to obtain a high etching rate when etching the crystalline AlO film as in the present embodiment, it is desirable that the step of supplying the $BCl_3$ gas, which is a boron-containing gas, is performed before the step of supplying the HF gas, which is a halide gas.

Further, in the present embodiment, the amorphous AlO film having a thickness of 9 nm or more is formed by the amorphous AlO film-forming step of step S10, the amorphous AlO film having a thickness of 9 nm or more is crystallized through the heat treatment at a temperature of lower than 900 degrees C. by the crystallization processing step of step S11, and then the amorphous AlO film having a thickness of 9 nm or more is etched to 2 nm or less by performing the crystalline AlO film-etching step of step S12 at a temperature equal to or lower than the crystallization processing temperature. As a result, it is possible to form a crystalline AlO film of 2 nm or less with good step coverage (e.g., step coverage of 80% or more) even on a surface having a structure with a high aspect ratio such as a 3D NAND or the like. That is, it is possible to increase the W embedded region, which is a control gate, and to achieve low resistance of the control gate, while suppressing the adverse effect on other films formed on the wafer 200 and the cell collapse.

(After-Purge and Atmospheric Pressure Return)

After the above etching process is completed, an $N_2$ gas is supplied into the process chamber 201 from each of the gas supply pipes 232c and 232d, and is exhausted from the exhaust pipe 231. As a result, the interior of the process chamber 201 is purged. The gas, the reaction by-product, or the like, which remains in the process chamber 201, is removed from the interior of the process chamber 201 (after-purge). Thereafter, the internal atmosphere of the process chamber 201 is substituted with an inert gas (inert gas substitution) and the internal pressure of the process chamber 201 is returned to the atmospheric pressure (atmospheric pressure restoration).

(Boat Unloading and Wafer Discharging)

Thereafter, the seal cap 219 is moved down by the boat elevator 115 to open the lower end of the reaction tube 203. Then, the processed wafers 200 supported by the boat 217 are unloaded from the lower end of the reaction tube 203 to the outside of the reaction tube 203 (boat unloading). The processed wafers 200 are discharged from the boat 217 (wafer discharging).

(3) Effect of the Present Embodiment

According to the present embodiment, one or more of the following effects may be obtained.

(a) When etching a crystalline film (film in a crystalline state) formed on a substrate, it is possible to improve the etching rate.

(b) Even a crystalline film formed on a surface of a structure having a high aspect ratio can be etched with good step coverage.

(c) According to the present embodiment, an amorphous AlO film having a diameter of 9 nm or more is formed, and a crystalline AlO film is formed by performing heat treatment on the amorphous AlO film at a temperature lower than 900 degrees C. Further, at a processing temperature lower than 900 degrees C., the crystalline AlO film having a thickness of 9 nm or more is etched to a thickness of 2 nm or less. As a result, a crystalline AlO film having a thickness of 2 nm or less can be formed without heat treatment at 1000 degrees C. or higher.

(d) The aforementioned effects may be similarly obtained even when forming a crystalline film of an oxide film or nitride film other than the AlO film, when using a boron-containing gas other than the BCl$_3$ gas, when using a halide gas other than the HF gas, or when using an inert gas other than the N$_2$ gas.

OTHER EMBODIMENTS

The embodiments of the present disclosure have been specifically described above. However, the present disclosure is not limited to the above-described embodiment, and various modifications may be made without departing from the gist thereof.

(Modifications)

Figure 7:
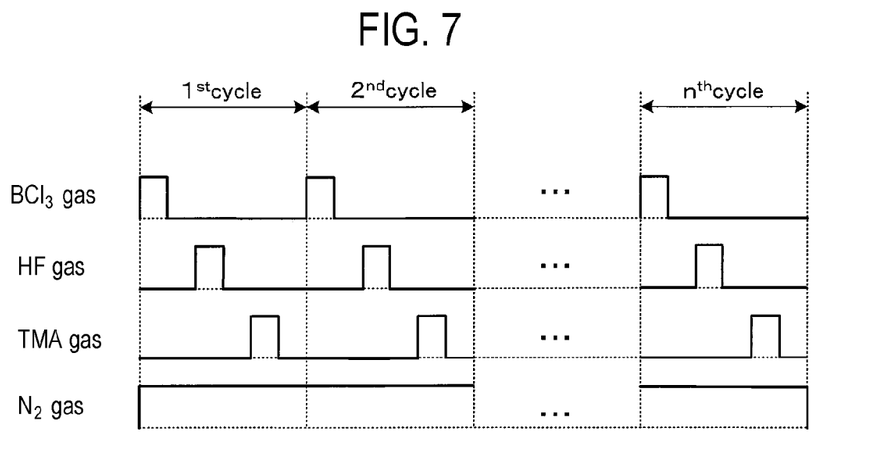
FIG. 7 is a diagram showing a modification of the etching process according to the embodiments of the present disclosure.

In the above-described embodiment, there has been described the example in which the crystalline AlO film is etched by performing the above-described steps S1 to S4 a predetermined number of times. However, the present disclosure is not limited thereto, and may be applied to cases where different gases are used. For example, as shown in FIG. 7, after the steps S1 to S4 described above, step S5 of supplying a gas having a hydrogen group described later and step S6 of purging an interior of the process chamber 201 are sequentially performed. That is, a cycle, which includes non-simultaneously and sequentially performing steps S1 to S6, is performed a predetermined number of times. Even in this case, the same effects as those of the sequence shown in FIG. 6 can be obtained.

(TMA Gas Supply, Step S5)

After sequentially performing the aforementioned steps S1 to S4, a trimethylaluminum (TMA, (CH$_3$)$_3$Al) gas, which is a gas having a hydrogen group, is supplied to the wafers 200 in the process chamber 201. Specifically, the valve 243e is opened to allow the TMA gas to flow into the gas supply pipe 232e. The flow rate of the TMA gas is adjusted by the MFC 241e. The TMA gas is supplied into the process chamber 201 via the gas supply pipe 232b and the nozzle 249b, and is exhausted from the exhaust pipe 231. At this time, the valves 243c and 243d are opened to allow an N$_2$ gas to flow into the gas supply pipes 232c and 232d. A nozzle for supplying the TMA gas may be installed separately from the nozzle 249b, and the TMA gas may be supplied from the nozzle different from the nozzle for supplying the HF gas.

An example of a processing condition in this step is described as follows.

TMA gas supply flow rate: 0.1 to 10 slm
N$_2$ gas supply flow rate (for each gas supply pipe): 1 to 10 slm
Each gas supply time: 5 to 200 seconds, specifically 60 to 150 seconds
Processing temperature: 200 degrees C. or higher and lower than 900 degrees C., specifically 300 to 800 degrees C., more specifically 300 to 450 degrees C.
Processing pressure: 150 to 400 Pa, specifically 200 to 300 Pa The TMA gas supply flow rate referred to herein is a flow rate including a flow rate of a dilution gas such as an N$_2$ gas used for vaporizing a liquid precursor.

By supplying the TMA gas to the wafer 200 under the above condition, AlF$_3$, which is produced by the reaction of AlCl$_3$ and HF in step S3, reacts with TMA, and is converted into (CH$_3$)$_2$AlF and (CH$_3$)Al. AlF$_3$ produced in step S3 is hard to volatilize due to its low vapor pressure, and tends to remain on the surface of the wafer 200 or in the process chamber 201. Since AlF$_3$ produced in step S3 is converted into volatile (CH$_3$)$_2$AlF, the discharge of AlF$_3$ from the surface of the wafer 200 or the interior of the process chamber 201 is promoted. Specifically, the following reaction is caused due to the supply of the TMA gas, and the discharge of AlF$_3$ existing in the process chamber 201 is promoted.

The gas having a hydrogen group supplied in this step is a gas having a hydrocarbon group, and may desirably be a substance which easily reacts with an F molecule of AlF$_3$ produced in step S4 and has a low molecular weight.

(Purge, Step S6)

The valve 243e is closed to stop the supply of the TMA gas. At this time, the APC valve 244 of the exhaust pipe 231 is left opened, the interior of the process chamber 201 is vacuum-exhausted by the vacuum pump 246, the residual gas is removed from the wafer 200, and the unreacted TMA gas or (CH$_3$)$_2$AlF that is a reaction by-product, which remains in the process chamber 201, are excluded from the process chamber 201. At this time, the valves 243c and 243d are kept opened to maintain the supply of the N$_2$ gas into the process chamber 201. The N$_2$ gas acts as a purge gas, so that the residual gas from the wafer 200 is removed, which makes it possible to enhance the effect of removing the unreacted TMA gas or (CH$_3$)$_2$AlF that is the reaction by-product, which remains in the process chamber 201, from the process chamber 201.

[Performing Predetermined Number of Times]

By performing a cycle a predetermined number of times (n times, where n is an integer of 1 or more), the cycle including non-simultaneously, that is non-synchronously and sequentially performing the above-described steps S1 to S6, the crystalline AlO film having a thickness of 9 nm or more formed on the wafer 200 can be etched and a crystalline AlO film having a predetermined film thickness, for example, a thickness of 2 nm or less can be obtained.

In step S5 described above, by continuously performing steps S1 to S6 a predetermined number of times, (CH$_3$)Al remaining on the wafer surface reacts as follows.

Thus, (CH$_3$)Al becomes a volatile gaseous substance. (CH$_3$)Al is separated from the surface of the wafer 200, and is exhausted from the exhaust pipe 231 to promote etching of the surface of the crystalline AlO film. Therefore, it is more desirable that steps S1 to S6 are performed a plurality of times.

As described above, the crystalline AlO film can be etched by the TMA gas used for forming the amorphous AlO film. When the amorphous AlO film-forming step of step S10 and the crystalline AlO film-forming step of step S12 are performed by the same apparatus, the gas supply system configured to supply the TMA gas can be commonly used. Therefore, it is possible to simplify the gas supply system.

In the above-described embodiments and modifications, there has been described the example in which the AlO film which is an oxide film and a metal oxide film is used as the crystalline film. However, the present disclosure is not limited thereto, and may be applied to a case where a high-k oxide film such as a molybdenum oxide ($MoO_3$) film, a zirconium oxide ($ZrO_2$) film, a hafnium oxide ($HfO_2$) film, a ZrHfO film or the like is etched as the metal oxide film, or a case where a silicon oxide ($SiO_2$) film is etched as the oxide film.

Further, in the above-described embodiments and modifications, there has been described the example in which the AlO film which is an oxide film and a metal oxide film is etched as the crystalline film. However, the present disclosure is not limited thereto, and may be applied to a case where an aluminum nitride (AlN) film, a titanium nitride (TiN) film, a titanium aluminum nitride (TiAlN) film or the like, which is a nitride film and a metal nitride film is etched as the crystalline film, or a case where a silicon nitride ($Si_3N_4$) film or the like is etched as the crystalline film.

Further, in the above-described embodiments and modifications, there has been described the example in which the $BCl_3$ gas, which is a boron-containing halide gas, is used as the boron-containing gas. However, the present disclosure is not limited thereto. Other boron-containing halide gases may be used as the boron-containing gas.

Further, in the above-described embodiments and modifications, there has been described the example in which the $BCl_3$ gas, which is a boron-containing halide gas, is used as the boron-containing gas. However, the present disclosure is not limited thereto. A diborane ($B_2H_6$) gas, a monoborane ($BH_3$) gas, a trisdimethylaminoboron (TDMAB, $B(N(CH_3)_2)_3$) gas, a triethylborane (TEB, $(C_2H_5)_3B$) gas or the like may be used as the boron-containing gas.

Further, in the above-described embodiments and modifications, there has been described the example in which the boron-containing gas is used. However, the present disclosure is not limited thereto. The boron-containing gas may be replaced with a tungsten-containing halide gas such as a tungsten hexafluoride ($WF_6$) gas or the like.

Further, in the above-described embodiments and modifications, there has been described the example in which the HF gas is used as the halide gas. However, the present disclosure is not limited thereto. A chlorine trifluoride ($ClF_3$) gas, a chlorine ($Cl_2$) gas, a nitrogen trifluoride ($NF_3$) gas, a fluorine ($F_2$) gas, a mixed gas of $F_2$ gas and nitrogen monoxide (NO) gas, or the like may be used as the halide gas.

Further, in the above-described modifications, there has been described the example in which the TMA gas, which is a gas having a hydrocarbon group, a gas having an alkyl group and a gas having a methyl group, is used as the gas having a hydrogen group. However, the present disclosure is not limited thereto. A tetrakisdimethylaminotitanium (TDMAT, $Ti(N(CH_3)_2)_4$) gas and a tridimethylaminosilane (TDMS, $((CH_3)_2N)_3SiH$) gas, which are gases having a methyl group, and the like may be used as the gas having a hydrogen group.

Further, in the above-described modifications, there has been described the example in which the TMA gas, which is a gas having a hydrocarbon group, a gas having an alkyl group and a gas having a methyl group, is used as the gas having a hydrogen group. However, the present disclosure is not limited thereto. For example, a triethylamine (TEA, $(CH_3CH_2)_3N$), which is a gas having an alkyl group and a gas having an ethyl group, or the like may be used as the gas having a hydrogen group.

Further, in the above-described modifications, there has been described the example in which the TMA gas is used as the gas having a hydrocarbon group. However, the present disclosure is not limited thereto. For example, an ammonia ($NH_3$) gas, which is a gas in which a hydrogen group is bonded to at least one of Al, Si and N, or the like, may be used as the gas having a hydrocarbon group. Further, the gas having a hydrocarbon group may be a gas containing an element constituting the aforementioned oxide film and a hydrogen group. Moreover, the gas having a hydrocarbon group may be a gas containing an element constituting the aforementioned oxide film and a hydrocarbon group. In this regard, the element constituting the oxide film refers to an element other than oxygen, and means Al in the case of an aluminum oxide film. The element constituting the oxide film means Si in the case of a silicon oxide film. The element constituting the oxide film means Zr in the case of a zirconium oxide film.

Further, in the above-described embodiments and modifications, there has been described the case where the crystallization processing step (S11) and the crystalline AlO film-etching step (S12) are sequentially performed in different chambers. However, the present disclosure is not limited thereto. The crystallization processing step (S11) and the crystalline AlO film-etching step (S12) may be continuously (in situ) performed in the same chamber.

It is desirable that the recipe used for the substrate processing are prepared separately according to the processing contents and are stored in the memory device 121c via an electric communication line or an external memory device 123. When starting the substrate processing, it is desirable that the CPU 121a properly selects an appropriate recipe from a plurality of recipes stored in the memory device 121c according to the contents of the substrate processing. This makes it possible to form films of various film types, composition ratios, film qualities and film thicknesses with high reproducibility in one substrate processing apparatus. In addition, the burden on an operator can be reduced, and the processing can be quickly started while avoiding operation errors.

The above-described recipes are not limited to the newly-prepared ones, but may be prepared by, for example, changing the existing recipes already installed in the substrate processing apparatus. In the case of changing the recipes, the recipes after the change may be installed in the substrate processing apparatus via an electric communication line or a recording medium in which the recipes are recorded. In addition, the input/output device 122 provided in the existing substrate processing apparatus may be operated to directly change the existing recipes already installed in the substrate processing apparatus.

In the above-described embodiments, there has been described the example in which the film is formed using the batch type substrate processing apparatus for processing a plurality of substrates at a time. The present disclosure is not limited to the above-described embodiments, but may be suitably applied to, for example, a case where a film is formed using a single-wafer type substrate processing apparatus for processing one or several substrates at a time. Furthermore, in the above-described embodiments, there has been described the example in which the film is formed using the substrate processing apparatus having a hot wall type process furnace. The present disclosure is not limited to the above-described embodiments, but may also be suitably applied to a case where a film is formed using a substrate processing apparatus having a cold wall type process furnace.

Even in the case of using these substrate processing apparatuses, film formation may be performed under the same processing procedures and processing conditions as those in the above-described embodiments and modifications, and the same effects as those of the above-described embodiments and modifications may be obtained.

In addition, the above-described embodiments and modifications may be used in combination as appropriate. The processing procedures and processing conditions at this time may be the same as, for example, the processing procedures and processing conditions of the above-described embodiments.

Example 1

Figure 8:
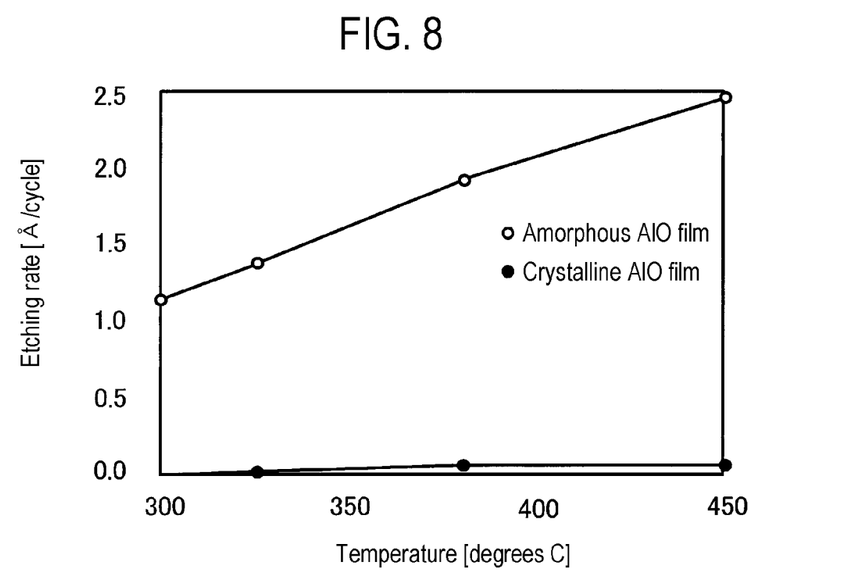
FIG. 8 is a diagram showing a relationship between a processing temperature and an etching rate when an amorphous AlO film and a crystalline AlO film are respectively etched by an etching process according to a comparative example.

FIG. 8 is a diagram showing the relationship between a processing temperature and an etching rate when an amorphous AlO film and a crystalline AlO film are respectively etched by an etching process according to a comparative example. As an etching process according to the comparative example, the amorphous AlO film and the crystalline AlO film on wafers were subjected to an etching process by performing a cycle a predetermined number of times, the cycle including non-simultaneously and sequentially performing the supply of a HF gas and the supply of a TMA gas.

As shown in FIG. 8, in the etching process according to the comparative example, it was confirmed that for the amorphous AlO film, the etching rate is good and the etching rate increases as the processing temperature in the etching process becomes higher. On the other hand, it was confirmed that for the crystalline AlO film, etching can be hardly performed even if the processing temperature is high. That is, it was confirmed that it is substantially difficult to etch the crystalline AlO film in the comparative example in which the $BCl_3$ gas is not supplied.

Example 2

Figure 9:
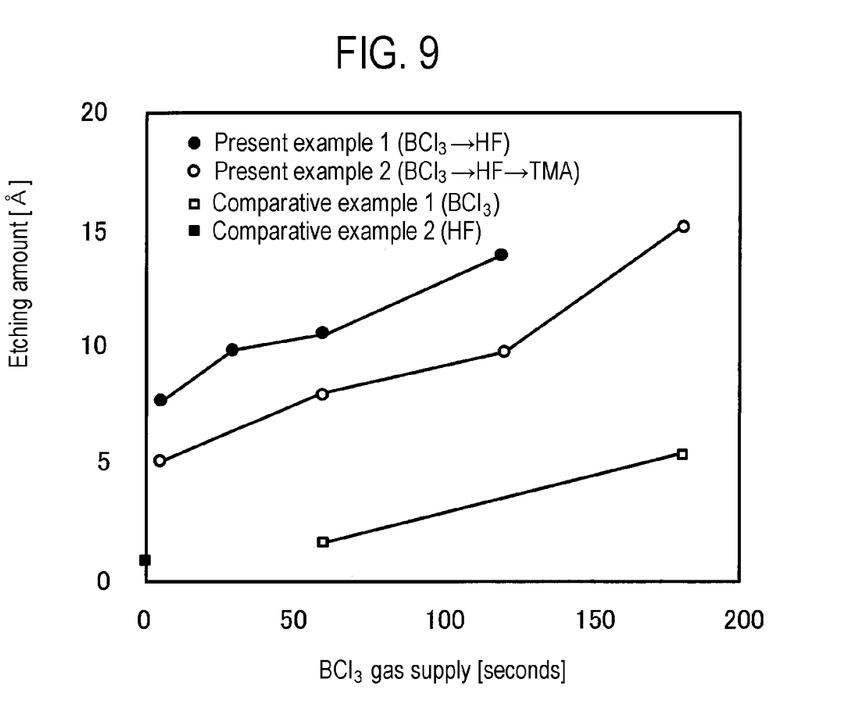
FIG. 9 is a diagram showing a relationship between a $BCl_3$ gas supply time and an etching amount when etching processes according to present examples and comparative examples are respectively performed on a crystalline AlO film.

FIG. 9 is a diagram showing the relationship between a $BCl_3$ gas supply time and an etching amount when etching processes according to present examples 1 and 2 and comparative examples 1 and 2 are respectively performed on a crystalline AlO film on a wafer. In present example 1, the substrate processing apparatus shown in FIG. 3 was used to etch the crystalline AlO film on the wafer according to the sequence shown in FIG. 6. In present example 2, the substrate processing apparatus shown in FIG. 3 was used to etch the crystalline AlO film on the wafer according to the sequence shown in FIG. 7. In comparative example 1, only the $BCl_3$ gas was supplied to the crystalline AlO film on the wafer by using the substrate processing apparatus shown in FIG. 3. In comparative example 2, only the HF gas was supplied to the crystalline AlO film on the wafer by using the substrate processing apparatus shown in FIG. 3. The HF gas supply time in present examples 1 and 2 and comparative example 2 is the same. In addition, the number of times of performing the gas supply cycle in present examples 1 and 2 and comparative examples 1 and 2 is the same.

As shown in FIG. 9, it was confirmed that the etching rate for the crystalline AlO film is improved in present examples 1 and 2 using both the $BCl_3$ gas and the HF gas as compared with comparative example 1 using only the $BCl_3$ gas and comparative example 2 using only the HF gas. It was also confirmed that the longer the supply time of the $BCl_3$ gas, the greater the amount of etching for the crystalline AlO film.

According to the present disclosure in some embodiments, it is possible to improve an etching rate for a crystalline film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    etching an oxide film, which is formed on the substrate and contains an element that is not oxygen, by performing a cycle a predetermined number of times, the cycle including non-simultaneously performing:
    (1) supplying a boron-containing gas to the oxide film;
    (2) supplying a halide gas to the oxide film; and
    (3) supplying a gas containing a hydrogen group and the element to the oxide film,
    wherein the boron-containing gas further contains a halogen element, and
    wherein the halide gas includes at least one selected from the group of a HF gas, a $ClF_3$ gas, a $Cl_2$ gas, a $NF_3$ gas, a $F_2$ gas and a mixed gas of a $F_2$ gas and a NO gas.

2. The method of claim 1, wherein in the act of etching the oxide film, (3) is performed after (1) and (2).

3. The method of claim 1, wherein in the act of etching the oxide film, (1), (2), and (3) are sequentially performed.

4. The method of claim 1, wherein the oxide film is a metal oxide film.

5. The method of claim 1, wherein the gas supplied in (3) is a gas that is capable of converting at least one by-product containing halogen element generated by the act of (1) and (2) into a substance whose vapor pressure is higher than a vapor pressure of the at least one by-product generated by the act of (1) and (2).

6. The method of claim 1, wherein in the act of etching the oxide film, (3) is performed after (2).

7. The method of claim 1, wherein in the act of etching the oxide film, (3) is performed after (1) and (2) are sequentially performed a predetermined number of times.

8. The method of claim 1, wherein the oxide film is a crystalline film.

9. The method of claim 8, further comprising (4) forming the crystalline film by heating an amorphous film formed on the substrate to a predetermined crystallization processing temperature and crystallizing the amorphous film.

10. The method of claim 9, wherein in (4), the crystalline film is formed by performing a heat treatment on the amorphous film having a first film thickness, and
    wherein in the act of etching the crystalline film, the etching on the crystalline film is performed until the crystalline film has a second film thickness smaller than the first film thickness.

11. The method of claim 10, wherein the crystallization processing temperature for crystallizing the amorphous film having the first film thickness is lower than a temperature required for crystallizing an amorphous film having the second film thickness.

12. The method of claim 11, wherein the act of etching the crystalline film is performed at a temperature equal to or lower than the crystallization processing temperature.

13. The method of claim 9, wherein the amorphous film is formed by performing a cycle a predetermined number of times, the cycle including non-simultaneously supplying a precursor gas and a reaction gas to the substrate.

14. The method of claim 13, wherein the gas supplied in (3) and the precursor gas are gases identical to each other.

15. A method of manufacturing a semiconductor device comprising processing the substrate according to the method of claim 1.

16. The method of claim 1, wherein the gas having the hydrogen group is a gas having a hydrocarbon group and the element.

17. The method of claim 1, wherein the boron-containing gas includes at least one selected from the group of a $BCl_3$ gas, a $B_2H_6$ gas, a $BH_3$ gas, a $B(N(CH_3)_2)_3$ gas and a $(C_2H_5)_3B$ gas.

* * * * *